(12) United States Patent
Grimm et al.

(10) Patent No.: US 9,903,920 B2
(45) Date of Patent: Feb. 27, 2018

(54) MAGNETIC FIELD SENSOR DEVICE

(71) Applicant: SENSITEC GMBH, Lahnau (DE)

(72) Inventors: Hubert Grimm, Mommenheim (DE); Viktor Spetter, Pfaffen-Schwabenheim (DE)

(73) Assignee: SENSITEC GMBH, Lahnau (DE)

( * ) Notice: Subject to any disclaimer, the term of this patent is extended or adjusted under 35 U.S.C. 154(b) by 101 days.

(21) Appl. No.: 14/888,429

(22) PCT Filed: Apr. 23, 2014

(86) PCT No.: PCT/EP2014/058220
§ 371 (c)(1),
(2) Date: Dec. 16, 2015

(87) PCT Pub. No.: WO2014/177436
PCT Pub. Date: Nov. 6, 2014

(65) Prior Publication Data
US 2016/0146907 A1    May 26, 2016

(30) Foreign Application Priority Data

May 2, 2013    (DE) .................. 10 2013 104 486

(51) Int. Cl.
*G01R 33/09*    (2006.01)
*G01R 33/00*    (2006.01)

(52) U.S. Cl.
CPC ........ *G01R 33/096* (2013.01); *G01R 33/0011* (2013.01)

(58) Field of Classification Search
CPC .... G01R 33/00; G01R 33/09; G01R 33/0011; G01R 33/0206; G01R 33/028
See application file for complete search history.

(56) References Cited

U.S. PATENT DOCUMENTS 5,737,155 A    4/1998    George et al.
6,191,578 B1 *    2/2001    Bezinge ............ B82Y 25/00
                                                324/207.12
(Continued)

FOREIGN PATENT DOCUMENTS

CN    101065720 A    10/2007
CN    102645675 A    8/2012
(Continued)

OTHER PUBLICATIONS

Korean Official Action (Oct. 21, 2016) for corresponding Korean App. KR 10-2015-7034361 (translation).
(Continued)

*Primary Examiner* — Son Le
(74) *Attorney, Agent, or Firm* — WRB-IP LLP

(57) ABSTRACT

A magnetic field sensor apparatus is provided for measuring one magnetic field vector component $H_e$. The apparatus includes at least one anisotropic magneto-resistive resistor device (AMR resistor device) on a chip substrate, where the resistor device includes a plurality of magneto-resistive AMR resistor elements which are connected in series by electrically conductive strips. At least one permanent-magnetic magnetization element with a magnetization axis is assigned to each resistor element in such a way that the resistor element is passed through by an initial magnetization field $H_0$ of the magnetization element in the direction of the magnetization axis. A measurement current $I_S$ flowing through the resistor element from a contact region between a first conductive strip and the resistor element to a contact region between the resistor element and a second conductive strip has a mean current direction axis at a predefined linearization angle $\alpha > 0°$ and $\alpha < 90°$ relative to the magnetization axis. A highly sensitive magnetic field sensor apparatus can be manufactured economically in large numbers.

15 Claims, 8 Drawing Sheets

(56) References Cited

U.S. PATENT DOCUMENTS

| | | |
|---|---|---|
| 6,822,443 B1 | 9/2001 | Dogaru |
| 2011/0221434 A1 | 9/2011 | Nishiyama et al. |
| 2011/0227569 A1 | 9/2011 | Cai et al. |
| 2012/0212218 A1 | 8/2012 | Fu et al. |
| 2013/0299930 A1* | 11/2013 | Paci ................. B82Y 25/00 257/422 |

FOREIGN PATENT DOCUMENTS

| | | |
|---|---|---|
| DE | 3443278 A1 | 5/1986 |
| DE | 4221385 A1 | 1/1994 |
| DE | 4319146 A1 | 12/1994 |
| EP | 0585008 | 8/1993 |
| EP | 0766830 | 4/1997 |
| KR | 1020070060109 | 6/2007 |
| WO | 2006035371 A1 | 4/2006 |
| WO | 2012103950 A1 | 8/2012 |

OTHER PUBLICATIONS

International Search Report (dated Jul. 28, 2014) for corresponding International App. PCT/EP2014/058220.
Chinese Official Action (dated Mar. 17, 2017) for corresponding Chinese Applicatino 201480025351.6.

* cited by examiner

MAGNETIC FIELD SENSOR DEVICE

BACKGROUND AND SUMMARY

The invention relates to a magnetic field sensor apparatus for measuring at least one magnetic field vector component comprising at least one anisotropic magneto-resistive resistor device arranged on a chip substrate. The resistor device comprises a plurality of magneto-resistive AMR resistor elements which are contacted in series by electrically conductive strips.

Electronic magnetic field sensor apparatus based on the mode of operation of AMR resistor layers are well-known from the prior art. The AMR effect (anisotropic magneto-resistive effect) is the property of a material to change its electrical resistance depending on an angle between an electrical current flowing through the material and an external magnetic field according to the position of the magnetic field vector relative to the flow of current through the material. This effect can be observed in particular in very long, thin and narrow strips of permalloy. Permalloy is an alloy consisting of 81% nickel and 19% iron. The electrical resistance of this material is greatest when the electric current is flowing in the direction of a magnetic field vector component. It is at its lowest when the electric current is aligned perpendicular to the electrical magnetic field vector component. On the molecular level, this effect is caused by a disturbance in the alignment of the electron spin of the atoms that depends on the direction of the electrical magnetization. In general, in the forementioned configuration, the electrical resistance is given by $R=R_\perp+(R_=R_\perp)\cos^2\Theta$, where $\theta$ is the angle between the magnetic field vector component and the direction of the flow of current in the AMR measuring strip. As can be seen in the above equation, a high sensitivity, i.e. a big change in resistance as the magnetic field to be measured changes, is particularly great when the current flows at about 45° to the magnetic field vector component. With this angular relationship between the current and the vector component, the change in resistance relative to a change in the magnetic field becomes linearized. The relationship between the measurement current $I_S$ and a magnetic field M(H) causing a change in the resistance, expressed above as a formula, is shown in FIG. 1. The magnetic field M(H) causing a change in the resistance is here symbolized by an initial magnetization $M_0$ in the direction of the flow of current $I_S$ together with a vector component $H_e$ perpendicular thereto provided by the external magnetic field to be measured.

The arrangement of what are known as barber's pole structures, i.e. thin, conductive structures arranged on an AMR measuring strip and consisting of extremely conductive material such as, for example, aluminum, copper, gold or silver, is known from the prior art for the design of magnetic field sensor apparatus. The barber's pole structures are aligned at 45° relative to the longitudinal extent of the AMR resistor strip, and are reminiscent of the advertising sign for a barber's shop in the USA, which is why they are called barber's pole structures. A current flowing through the resistor strips is thereby forced to flow in a direction at 45° to the longitudinal extent of the strip, as is shown in FIG. 2. As a result, the curve showing the dependency of the resistance on the alignment of the current vector shown in FIG. 1 is shifted by 45° relative to the magnetic field vector, so that it can, as shown in FIG. 2, be shifted to a linearized region. Depending on the alignment of the barber's pole structures, a positive or negative edge of a linearization between the resistor and the magnitude of the magnetic field to be measured is the result, provided that the external magnetic field is aligned longitudinally or transversely to the extent of the AMR resistor strip.

Magnetic field sensor apparatus based on barber's pole structures are known from, for example, DE3442278A1. Four magnetic field sensor apparatuses of this type with differently aligned barber's pole structures are here connected together in a Wheatstone measuring bridge, where an initial magnetization of the internal magnetization $M_0$ of the resistor strips is achieved by an external magnetic field generated by a macroscopic magnetic coil, in order to create a linearized dependency of the resistance on the external magnetic field $H_e$. For this purpose, a magnetic field is generated perpendicular or parallel to the current flow, generating an initial magnetization of the AMR resistor measuring strips, so that a magnetic field $H_e$ to be measured and aligned perpendicular creates a linear change in the electrical resistance of the magnetic field sensor apparatus, which is measurable and from which the magnitude of the external magnetic field $H_e$ can be determined.

An improvement to a design of this type is described in, for example, DE4319146C2, which proposes that a series of AMR resistor devices with barber's pole structures is arranged along a conductor through which a flip current is flowing, with the flip current conductor effecting an initial magnetization $M_0$ in the longitudinal direction of the AMR measuring strips. By flipping, i.e. reversing of the internal magnetization, a realignment or calibration of the resistance behavior can be achieved. An external magnetic field $H_e$ perpendicular thereto can be measured with high sensitivity. In order to generate an initial magnetization $M_0$ in the longitudinal direction of the AMR resistor strips, a flip current $I_f$ flowing through a flip conductor is used, as a result of which an increased current has to be used to provide an initial magnetization. The application of the barber's pole structures is disadvantageous from the point of view of process technology, as very fine microstructures have to be arranged on the AMR resistor strips, and short circuits between the individual strips have to be avoided. The arrangement of the flip conductor increases the number of manufacturing steps, and the control of the flip current increases the demands made on the control electronics.

The ratio of $R_\perp$ to R– is in the region of 3% for permalloy. The result of the anisotropic shape is that magneto-resistive resistors, in which the strips are particularly thin and the length is chosen to be large in comparison with the width, exhibit a preferred magnetization direction as a result of the anisotropic shape in the longitudinal direction, i.e. parallel to the direction of the current. In order to impress an initial magnetization, and to stabilize a magnetization in a resistor strip, the provision of additional macroscopic permanent magnets mounted in the vicinity of the magneto-resistive layer structure is known. These permanent magnets are intended to prevent the internal magnetization of the strips from reversing. Additional permanent magnets of this sort are described for example in DE4221385C2. A particular disadvantage of this solution is the high assembly effort, along with the resulting structural size and the costs of the components used.

EP0766830B describes a magneto-resistive reading head for a digital magnetic storage medium. EP0585008A2 presents a further magneto-resistive reading head for a digital magnetic storage medium, e.g. for a hard disc application, having two permanent magnets between which a single magneto-resistive resistor element is arranged. The two permanent magnet elements provide an internal magnetization direction inside the resistor element. The resistor element is contacted by electrically conductive strips in such a way that a measurement current, displaced about 45° relative to the magnetization direction, can flow through the resistor element. This configuration is selected so that a magnetization location carrying bit information of a ferromagnetic magnetic storage medium, e.g. of a magnetic tape or of a magnetic storage disk, gives rise to a defined rectangular and symmetrical change in resistance, with steep edges and minor spatial/temporal displacement in the resistor element, so that a magnetic bit storage density is increased, crosstalk between adjacent magnetic field bits is suppressed, and analog server-data can be read out symmetrically. The reading head is optimized to detect at high speed binary magnetic field information with a similar spatial extent to the resistor element itself, and is not suitable for detecting a strength and direction of a magnetic field component of an external magnetic field, e.g. for a compass or current measuring application.

For this reason, the previously known AMR magnetic field sensor apparatuses result in the problem that using barber's pole stripes for linearization of the characteristic resistance curve means that on the one hand the process technology must arrange very fine barber's pole structures on the resistor strips, and on the other hand external circuitry and an additional flip conductor or external magnets for initial magnetization or for maintaining the internal magnetization must be provided, which raise the current consumption and increase the complexity of the electronic circuit.

U.S. Pat. No. 6,822,443 B1 demonstrates a magnetic field sensor apparatus for the measurement of two magnetic field components at an angle to one another. The magnetic field sensor apparatus comprises two Wheatstone measuring bridges that can be evaluated separately from one another. Each measuring bridge comprises two magnetically neutral resistors and two magneto-resistive resistors. The magneto-resistive resistors can be AMR/SDT/GMR or Hall resistors. In order to increase the sensitivity to magnetic fields, flux concentration elements can be arranged in the region of the magneto-resistive resistors, and consist of NiFe, are unmagnetized and referred to as a "free ferromagnetic layer".

WO 2012/103950 A1 presents an AMR resistor device whose bridge resistors consist of a series connection of individual resistor elements, where the arrangement of the resistor elements of one bridge resistor meshes interdigitally with the arrangement of the resistor elements of a second bridge resistor.

It is desirable to propose an AMR magnetic field sensor apparatus in which a highly sensitive linearized characteristic resistance curve can be achieved without having to accept the disadvantages of external macroscopic support magnets, barber's pole structures and a flip current conductor, so that an economical magnetic field sensor apparatus can be obtained.

In accordance with an aspect of the invention, the magnetic field sensor apparatus for measuring a magnetic field vector component $H_e$ comprises one anisotropic magneto-resistive device (AMR resistor device) arranged on a chip substrate, where the resistor device comprises a plurality of magneto-resistive AMR resistor elements which are contacted by electrically conductive strips. At least one permanent-magnetic magnetization element with a magnetization axis is assigned to each resistor element in such a way that the resistor element is passed through by an initial magnetization field $H_0$ of the magnetization element in the direction of the magnetization axis. The invention is based, according to an aspect thereof, on the fact that a measurement current $I_S$, flowing through the resistor element from a contact region between a first conductive strip and the resistor element to a contact region between the resistor element and a second conductive strip, has a mean current direction axis at a predefined linearization angle $\alpha > 0°$ and $\alpha < 90°$ relative to the magnetization axis.

In other words, a magnetic field sensor apparatus is proposed comprising at least one and in particular a plurality of resistor devices, i.e. separately connectable AMR resistors, where each resistor device comprises a plurality of AMR resistor elements connected electrically in series. The resistor elements are contacted by electrically conductive strips in such a way that current can flow in series through the AMR resistor elements, where one or two magnetization elements whose initial magnetization field $H_0$ results in an internal initial magnetization $M_0$ inside the resistor element are assigned to each resistor element. The arrangement of the magnetization element relative to the direction of flow of the current, which is predefined by the alignment and shape of the conductive strips and their contact to the resistor element, is selected in such a way that a linearization angle $\alpha$ is created between the magnetization axis of the magnetization element and the direction in which the measurement current is flowing, and can be adjusted between 0° and 90°. As a result, as is shown comparatively in the characteristic resistance curves in FIG. 2, a displacement of the characteristic resistance curve can be adjusted in the direction of a linear region $\alpha=45°$ between the magnetization vector and the direction of current flow, so that a linearized characteristic curve of the resistance depending on an external magnetic field $H_e$ can be achieved. The current through the resistor element can flow at an angle relative to the current through the conductive elements, where the magnetization vector can be aligned parallel or perpendicular to the direction of the flow of current through the conductive elements. Alternatively, the directions of the flow of current through the conductive elements and the resistor element can be identical, whereas the magnetization vector is aligned at an angle $\alpha$ relative to the overall direction of the flow of current.

It is for example possible for a single magnetization element to provide an initial magnetization $M_0$ for a plurality of resistor elements, although preferably a separate magnetization element or a pair of magnetization elements oriented in the same direction can be assigned to each resistor element. The direction of the flow of current within the resistor element can be set by the position of the contact of the resistor element with the conductive strips—i.e. the shape of the AMR resistor elements and the position of the contact locations between the conductive strips and the resistor element. This can preferably be adjusted to be neither parallel nor perpendicular to the alignment of the series of AMR resistor elements. The position of a magnetization element with magnetization in the direction of the longitudinal or transverse alignment of the resistor elements defines, relative to the direction of current flow through the resistor element, the linearization angle $\alpha$. Due to the structural arrangement of the magnetization elements relative to the direction of the flow of current through the AMR resistor elements, a displacement of the characteristic resistance curve can be achieved in such a way that a linearization of the resistance is provided dependent on the magnetic field. The arrangement of barber's pole strips and the artificial creation of a flip magnetic field or of an initial magnetization field with a flip conductor are not required, and a homogeneous guidance of the magnetic field of the permanent-magnetic elements through the resistor element can be achieved. The design of the sensor chip is simple to manufacture, requires fewer electrical connections, and control electronics of a simple design. Current consumption is lowered.

In principle, the linearization angle can assume any value between 0° and 90°. In accordance with one advantageous embodiment of the invention, the value of the linearization angle $|\alpha|=45°$. The linearization angle $\alpha$ can be set to any desired value, and is only defined by the arrangement of the magnetization axis of the magnetization element relative to the axis of the flow of current through the AMR resistor element. By a setting of 45°, a perfect linearization of the AMR characteristic resistor curve is achieved relative to the AMR characteristic resistance curve, so that the value of the external magnetic field can be verified directly from the change in resistance, in particular as long as $H_e<H_0$ applies. The evaluation electronics are thus simplified, and increased precision of measurement is achieved.

In principle, a single resistance element is sufficient for the measurement of a magnetic field vector component. In accordance with an advantageous development, each resistor device can comprise a series circuit of more than 10 AMR resistor elements which are preferably arranged along one or more straight and parallel rows on the chip substrate. The magnetization axis of the magnetization elements can be aligned parallel or perpendicular to the longitudinal extent of the resistor device. The arrangement often or more AMR resistor elements results in an increased value of the AMR resistance, so that a current consumption is reduced, thus lowering electrical losses. The resistor elements are preferably arranged in a straight row, and a plurality of parallel rows can be connected electrically in series in order to form a single resistor device. An increased packing density is achieved by this means. Each individual resistor element can preferably have a resistance value of between $5\Omega$ and $50\Omega$. A series circuit thus yields a resistance value of at least $50\Omega$, which can typically adopt values of several $100\Omega$ to a few $k\Omega$. This means that a lower measurement current and hence a lower energy consumption by the apparatus can be achieved.

The magnetization axis of the magnetization element is preferably parallel, perpendicular or 45° to the longitudinal extent of the AMR resistor elements arranged in series. Accordingly, the contacting locations and the shape of the conductive strips are arranged and designed in such a way that the current flows at an angle $\alpha$ relative to the initial magnetization $M_0$ of the resistor element. The magnetization elements arranged on the resistor device can here be aligned in the same way for all the resistor elements. This allows a single resistor or a resistor device arranged on a chip substrate in a compact and spacesaving manner to be provided.

In accordance with one advantageous development, a resistor element can be formed as a platelet and can have a symmetrical footprint, in particular a footprint of a regular polygon, a circle or an ellipse. By the platelet design, which results in a low thickness in comparison with the length and width of the resistor element is given, and by a symmetrical footprint, an arrangement of a large number of resistor devices is permitted on one chip substrate, where the effective area of the chip substrate can be exploited optimally. For example, a highly concentrated AMR resistor device having a high sensitivity can thus be arranged in a small space. By designing the resistor element with a symmetrical footprint, the direction of current flow is predetermined solely by the contact point and by the shape of the conductive strips contacting the resistor element. A symmetry of the resistor element relative to the contact points or the contact areas, and in relation to the magnetization vector of the magnetizing element has on the one hand the advantage that a homogeneous current distribution of the measurement current $I_S$ through the resistor element is achieved, while on the other hand a uniform initial magnetization $M_0$ is given within the resistor element. In this way, the direction of the flow of current and the magnetic field permeating through the AMR resistor element, and hence 3 the linearization angle $\alpha$, is defined exactly.

In accordance with one advantageous development, one permanent magnetization element can be assigned to each resistor element, where a magnetic flux of the magnetization element passes at least partly through the resistor element. A permanent magnetization element consists preferably of a ferromagnetic material such as iron, cobalt, nickel or ferrite, or an alloy of these, for example CoPtCr, or rare-earth compounds such as CoSm or NdFeB, which generate a static magnetic field with a north and a south pole. Magnetic field lines emerge from both polar ends, and are closed again by an external stray field. In the region of this stray field, the resistor element is arranged such that the stray field passes through the resistor element from north pole to south pole at a linearization angle $\alpha$ relative to the direction of current flow. In this embodiment, a single permanent magnetization element, i.e. an elementary magnet, is assigned to each resistor element. The pairing of a resistor element and a permanent magnetization element here represents the smallest possible unit of a resistor device incorporated in the magnetic field sensor apparatus.

In the embodiment mentioned above, it is particularly advantageous for the magnetization element to cover the full area of the resistor element, so that the stray field passes through the AMR resistor element in large areas. In this way, a good initial magnetization of the AMR element by the initial magnetization field $H_0$ is achieved.

As an alternative to the embodiments mentioned above, it can be advantageous for two permanent magnetization elements aligned along a common magnetization axis to be assigned to the resistor element of the resistor device, where a magnetic flux from the north pole of one magnetization element to the south pole of the adjacent magnetization element passes at least partly through the resistor element. It is thus proposed in this embodiment that two or more magnetization elements are arranged in a row, where a magnetic flux from the respective north pole of one magnetization element to the south pole of the respective adjacent magnetization element results. The permanent magnetization element is arranged in this magnetization flux in such a way that the stray field between the two magnetization elements passes through it. There is no 1:1 assignment of a single magnetization element to a resistor element here, but rather each resistor element is arranged in the space in between a pair of magnetization elements. This means that magnetization elements and resistor elements do not overlap, but are arranged offset relative to one another.

In the aforementioned exemplary embodiment, it can furthermore be advantageous for the resistor element to be arranged between the end regions of the two magnetization elements, where the end regions facing towards them preferably enclose the resistor element with a complementary shape along at least a section of its periphery. It is thus advantageously proposed that the end region of each magnetization element has a peripheral line such that it encloses the periphery of the resistor element with a complementary shape, so that an undisturbed magnetic flux can pass from the north pole of the one magnetization element through the AMR resistor element to the adjacent south pole of the second magnetization element. Stray field losses are thus low, and a homogeneous initial magnetization field $H_0$ can be achieved.

In accordance with a further advantageous embodiment of the invention, the layer thickness of the resistor element and of the magnetization element are at most 10 µm, preferably <1 µm, in particular <50 nm, where in particular the layer thickness of the magnetization element is not more than 10 times the layer thickness of the resistor element. As a result of the size of the layer thicknesses, which is at least smaller than 10 µm and preferably <1 µm, it is ensured that a compact chip structure for the AMR magnetic field sensor apparatus is achieved, with no need to employ macroscopic magnetic field coils or the like. The permanent magnet elements, like the AMR resistor strips, are located on the same or on different planes within a chip substrate, and can be integrated into a compact chip structure.

In accordance with a further advantageous embodiment of the invention, at least two and in particular several resistor devices are comprised in one apparatus, where each resistor device comprises a plurality of resistor elements arranged in straight and parallel rows and said rows of two resistor devices are arranged to mesh with one another interdigitally, where the linearization angles of the interdigitally arranged resistor devices are preferably displaced by 90° relative to one another, and where the resistor devices are in particular interconnected in the form of a half-bridge or a full bridge. In this embodiment, a magnetic field sensor apparatus is proposed comprising two or more, and preferably four, resistor devices, i.e. individual and separately contactable AMR measuring resistors that are arranged nested compactly together on the chip substrate. Each resistor device consists of an electrical series connection of several parallel resistor elements arranged in straight rows, and the rows of the resistor elements belonging to the resistor devices mesh interdigitally in rows of an adjacent resistor device in order to achieve a compact design. Since the rows of different resistor devices are arranged nested with one another, the process technology can achieve a similar behavior of the resistor devices connected to form a half-bridge or full bridge, so that an equivalent resistance behavior of the resistors interconnected in a measuring bridge circuit, i.e. resistor devices, is ensured.

In accordance with an advantageous development of the invention, it is possible for the magnetization elements to be arranged in a lower planar layer on the chip substrate, on top of that a layer comprising the AMR resistor elements, and on top of that a layer comprising the contacting strips. This design proposes that on the chip substrate, which for example also has an insulation layer applied, the magnetization elements consisting of a permanent-magnetic material such as CoPtCr are arranged first. Building on top of that, in a layer located above, the resistor elements are arranged in such a way that a 1:1 ratio or a 1:2 ratio is established between resistor elements and magnetization elements. As a general rule, the magnetization elements have a larger surface area than the resistor elements. After this, the contact strips are arranged between the AMR resistor elements and electrical contact is made with them in such a way that a current flowing through the rows of resistor elements has a linearization angle α relative to the initial magnetization $M_0$ of the resistor elements. A design of this type has the advantage that the magnetization elements, which are designed in their surface area, are arranged on a lower plane, and the resistor elements with their smaller shape and the contact strips are arranged on higher planes of the chip substrate, so that the usual methods can be used for manufacturing the magnetic field sensor apparatus.

Starting from the aforementioned layer structure of the magnetic field sensor apparatus, it can be advantageous if an intermediate layer which is essentially magnetically neutral is arranged between the layer of resistor elements and the layer of the magnetization elements, where the intermediate layer consists of an electrical insulator which prevents short circuits between the resistor elements via the electrically conductive magnetization elements. This layout, which is made very thin in comparison with the magnetization elements and resistor elements, is preferably magnetically neutral, i.e. has a permeability µ=1 (paramagnetic), in order not to disturb the magnetic flux.

It is furthermore proposed that an insulating covering layer is applied on top of the layer comprising the contacting strips, so that the contacting strips are insulated from the chip surface by a covering layer. In this way, a layer structure is proposed for the chip substrate that describes a highly compact and easily manufactured magnetic field sensor apparatus.

In accordance with a further development of the aforementioned chip structure, it can be advantageous if a compensation conductor is arranged on one or more further planar layers, in particular on an upper planar layer, through which conductor a compensation current $I_C$ can flow in order to generate a compensation magnetic field perpendicular to the magnetization axis of the initial magnetization $M_0$ and thus against the direction of the external magnetic field $H_e$ to be measured. The compensation current $I_C$ of the compensation conductor can compensate for a component to be measured of an external magnetic field at the magnetically sensitive regions of the sensor. Thus a compensation current $I_C$ can for example flow through the compensation conductor, generating a magnetic field opposed to the direction of the magnetic field $H_e$ to be measured, so that the external magnetic field $H_e$ to be measured is compensated, or its effect attenuated, so that a high sensitivity, i.e. linearity between the characteristic resistance curve and the external magnetic field, can be achieved. It is possible with the compensation magnetic field to measure magnetic fields with different scale magnitudes, and to adjust or calibrate the measuring range of the magnetic field sensor apparatus. The magnitude of the compensation current $I_C$ thus provides information about the size of the external magnetic field. The compensation conductor is aligned in the direction of the initial magnetization $M_0$ at the location of the resistor element, and the direction of the flow of current of the compensation current $I_C$ provides information about the direction of the external magnetic field $H_e$.

In a subsidiary aspect, a compass system is proposed in which one, two or three magnetic field sensor apparatuses are arranged at angles to one another, preferably 90° to one another, which can perform a one, two or threedimensional measurement of a magnetic field, where in particular in an electronic module an acquisition of the directional magnitude of the magnetic field, in particular of the Earth's magnetic field, can be performed with the aid of a magnetic field sensor arrangement presented above. Compass systems of this type are found in various applications and devices, for example navigation systems, Smartphones, tablet computers or other applications in which a direction of a magnetic field, in particular of the Earth's magnetic field, is to be displayed. A compass system of this type, fitted with the above-described magnetic field sensor apparatus, exploits its advantages and has in particular a reduced current consumption, longer service life and lower component costs.

Furthermore, in a subsidiary aspect, a current measuring system is proposed comprising at least one magnetic field sensor apparatus as discussed above, in order to determine a current magnitude of one or more conductors. A conductor through which current flows generates a magnetic field surrounding it, where it is possible by measurement of the strength of the magnetic field surrounding the conductor to determine the current that is flowing through the conductor without making contact. Current measuring systems of this type are widely used as transportable systems, but also in stationary form to monitor the flow of current inside machines or equipment, for example electricity distribution installations. Apart from the connections for the measurement current through the AMR resistor devices, and possibly current connections for the compensation conductor, the proposed passive magnetic field sensor apparatus does not comprise any other connections, and in particular no connections for a flip current conductor, so that contactless current measurement can be performed by a relatively simple electronic evaluation unit. The current measurement system can comprise a plurality of measuring apparatuses of this type to permit an extremely precise measurement of current.

BRIEF DESCRIPTION OF THE DRAWINGS

Further advantages emerge from the following drawing description. Exemplary embodiments of the invention are shown in the drawing. The drawing, the description and the claims contain many features in combination. The person skilled in the art will also consider the features individually, and combine them into useful further combinations.

The figures show in.

Elements that are of the same type are given the same reference character in the figures.

DETAILED DESCRIPTION

Figure 1:
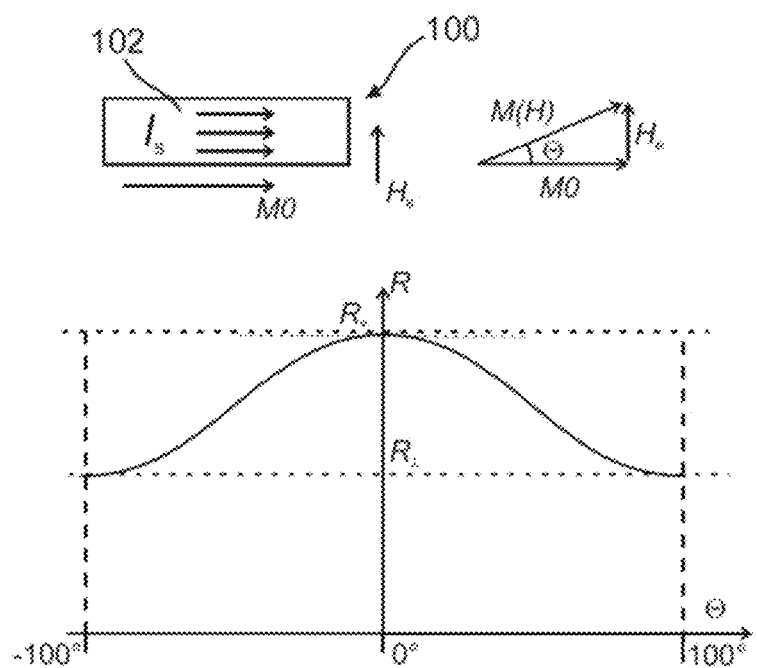
FIG. 1 a characteristic resistance curve of a conventional ANR resistor element relative to an external magnetic field $H_e$.

FIG. 1 shows a characteristic resistance curve depending on a magnetic field M(H) relative to the direction of a flow of measurement current $I_S$ through an AMR resistance strip 102 of a magnetic field sensor apparatus 100. The characteristic resistance curve R(M) is governed by the formula $R=R_\perp+(R_=-R_\perp)\cos^2\Theta$, where $\theta$ represents the angle between the direction of current flow IS and overall magnetic field M(H). The overall magnetic field M(H) is made up of the magnetic field of an internal initial magnetization $M_0$ and an external magnetic field $H_e$ to be measured. It can be seen that in the case of small magnetic fields $H_e<M_0$ only a small change occurs in the resistance R when the external magnetic field $H_e$ changes. A configuration of this kind is therefore disadvantageous, since the sensitivity to small magnetic fields is relatively low, as the characteristic resistance curve in this region only has a small slope.

Figure 2:
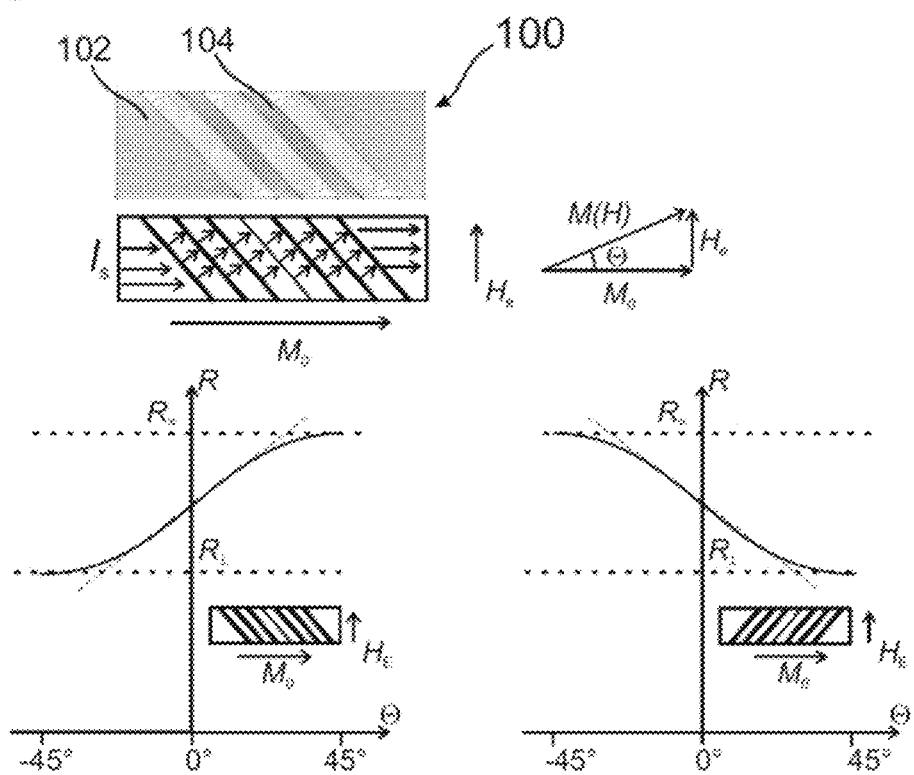
FIG. 2 characteristic resistance curves of an AMR resistance strip with barber's pole structures known from the prior art.

In FIG. 2, which illustrates an AMR resistor apparatus 100 according to the prior art, in which an AMR resistor strip 102 having barber's pole structures 104, i.e. highly conductive metallized strips such as gold or copper metallization, is arranged at an angle of 45° on the AMR resistor strips 102. As is shown in the schematic sketch, a flow of current $I_S$ through the AMR resistor strip 102 in a direction at an angle of substantially 45° to the longitudinal extent of the resistor strip 102 is developed through the AMR resistor strip 104, so that the flow of current adopts a linearization angle α of 45° relative to a parallel internal magnetization $M_0$ or a perpendicular external magnetic field $H_e$. The resistance curve shown in FIG. 1 is accordingly displaced, in a region where the edge of the curve is steep, where a linear relationship is found between the resistance and the magnetic field, so that a small change in an external magnetic field $H_e$ causes a linear change of the total resistance R of the resistance of the AMR magnetic field sensor apparatus. The sensitivity of the magnetic field sensor apparatus can be significantly increased by means of linearization using barber's pole structures.

FIG. 3 shows a first exemplary embodiment of a magnetic field sensor apparatus 14. The smallest element of the resistor device 14 here consists of an octagonal AMR resistor element 16, formed as an AMR platelet and contacted by two conductive strips 18a and 18b. Due to the specific design of the end region of the resistor strip 18 and its contact regions 24 and 26, through which a measurement current $I_S$ enters and leaves the AMR resistor element 16, the flow of current through the AMR resistor element 16 is forced to flow through the conductor strips 18 at a 45° angle relative to the total flow of current. A permanent magnet element 20 is arranged underneath the AMR resistor element 16, and the initial magnetization $M_0$ is aligned in the direction of the measurement current $I_S$ through the conductive strip 18, i.e. in the direction of the longitudinal extent of a row of adjacent resistor elements 16 connected by conductive strips 18. The external stray flux from the north pole to the south pole of the magnetization element 20 passes through the resistor element 16 and creates an internal initial magnetization $M_0$. Since the flow of current $I_S$ through the resistor element is angled at 45° to the external magnetic field $H_e$, the change in the magnitude of an external magnetic field $H_e$ perpendicular to the initial magnetization has the effect of causing a linearized change in the electrical resistance through the resistor device 14. This means that, in accordance with the characteristic resistance curve shown in FIG. 2, a linear change in resistance is achieved when there is a small change in the external magnetic field, without the need to provide either barber's pole structures or an external magnetization by means of an auxiliary macroscopic magnet.

Figure 3A:
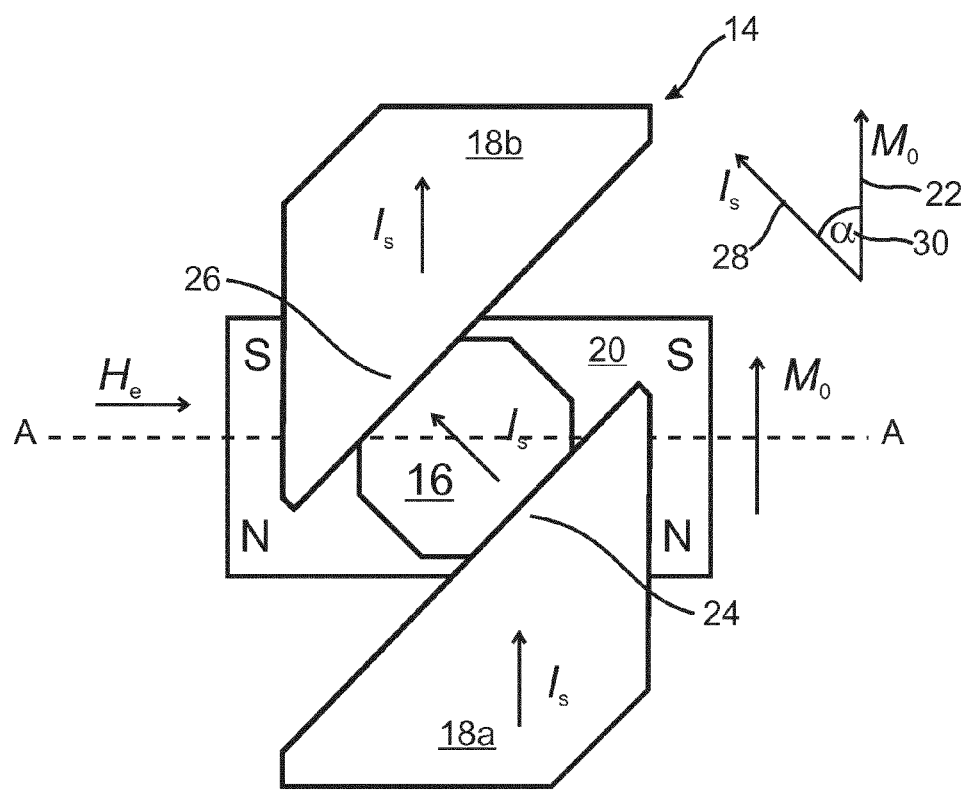
FIG. 3 a first exemplary embodiment of a resistor device shown in plan view and with a sectional illustration of the layers.
Figure 3B:
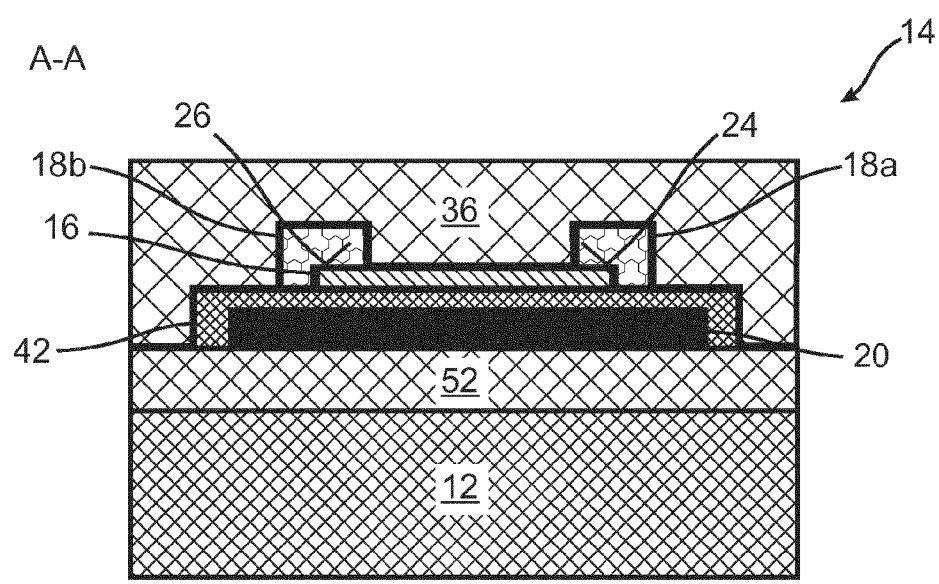

FIG. 3b shows the section A-A in FIG. 3a through the chip substrate 12 of the resistor device 14. An insulation layer 52 is first arranged on the chip substrate 12. A permanent-magnetic magnetization element 20 is arranged on this insulation layer 52 and is made with a larger area than the disc-shaped AMR resistor element 16. The permanent magnetization element 20 is separated from the AMR resistor element 16 by an intermediate layer 42 which is electrically insulating and magnetically neutral. The AMR resistor element 16 is arranged on the intermediate layer 42, and is contacted electrically by the conductive strips 18 at the first and second contact regions 24, 26. The shape and position of the contact regions 24, 26 result in a direction of current flow through the AMR resistor element 16 which differs by a linearization angle α from the initial magnetization $M_0$ caused by the magnetic field $H_0$ of the magnetization element 20. Finally, a covering layer 36, also consisting of electrically insulating and magnetically neutral material, is applied in order to enclose the resistor device 14 from the environment.

Proceeding on the basis of FIG. 3, FIG. 4 shows a further exemplary embodiment of a magnetic field sensor apparatus 14. In addition to the embodiment according to FIG. 3, a compensation conductor 44, through which a compensation current $I_C$ can flow, is arranged on the top face above the conductive strips 18. A compensation magnetic field that counteracts and attenuates the external magnetic field $H_e$ to be measured can be created by the compensation current $I_C$. In this way, compensation of the external magnetic field to be measured can be achieved, permitting an adjustment or setting of the order of magnitude of the magnetic field to be measured. This allows the magnetic field sensor apparatus 14 to be used for the measurement of magnetic fields of different strengths. If the resistance of the resistor apparatus is regulated to a constant value by the compensation current, the size of the compensation current $I_C$ provides information about the strength of the external magnetic field.

Figure 4A:
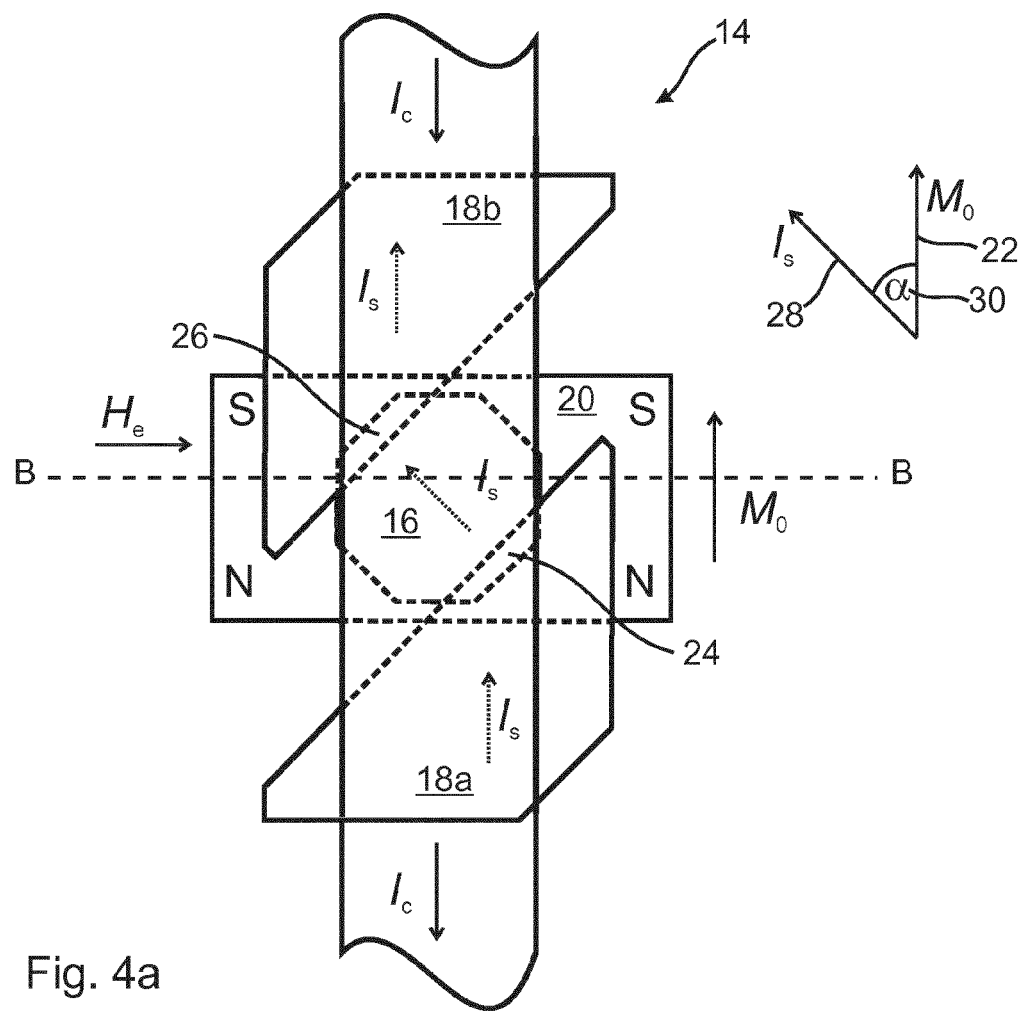
FIG. 4 a further exemplary embodiment of a magnetic field sensor apparatus with compensation conductors with a sectional illustration of the layers.
Figure 4B:
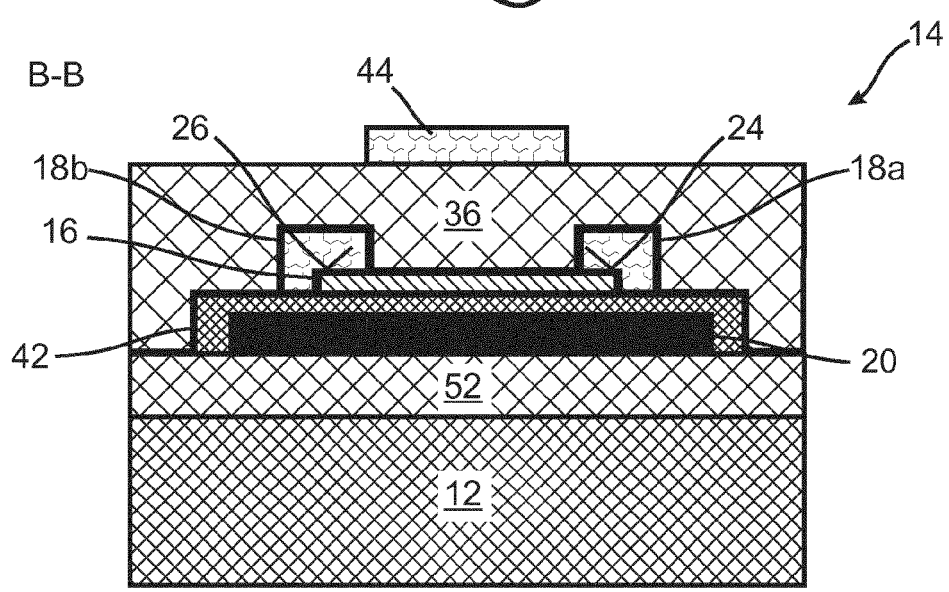

FIG. 4b shows a sectional view B-B through the layer structure of the chip substrate of the magnetic field sensor apparatus 14 as shown in FIG. 4a; it is similar to that of FIG. 3b, and a compensation conductor 44 is arranged above the covering layer 36. A further covering layer can again be arranged on top of this in order to enclose the chip layout against external environmental influences. The size relationships shown in the sectional FIGS. 3b and 4b are not true to scale; the dimensions have been selected only for the purposes of illustration.

Figure 5:
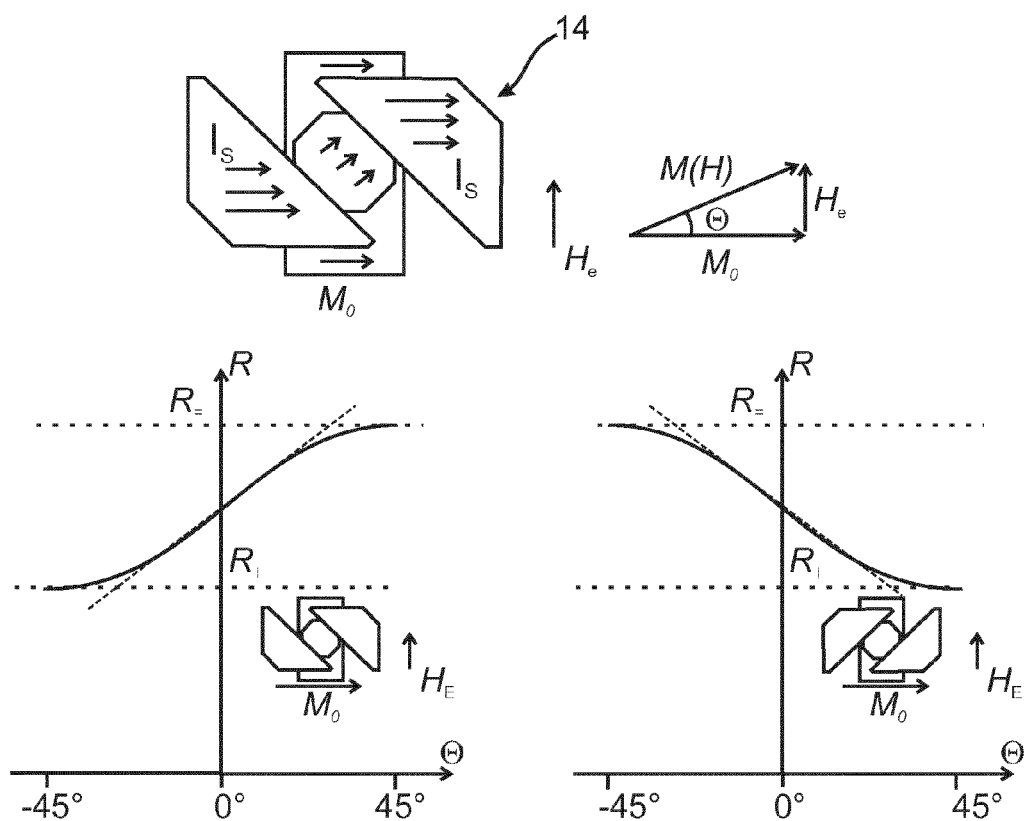
FIG. 5 a characteristic resistance curve of an exemplary embodiment of an AMR resistor apparatus.

FIG. 5 shows, corresponding to FIG. 12, the characteristic resistance curve for an embodiment of a magnetic field sensor apparatus 14, where the resistance changes linearly with a change in an external magnetic field $H_e$. Depending on the direction of the flow of current $I_S$ through the AMR resistor element 14 relative to the external magnetic field $H_e$, a positive or negative slope of the characteristic resistance curve R is obtained.

Figure 6:
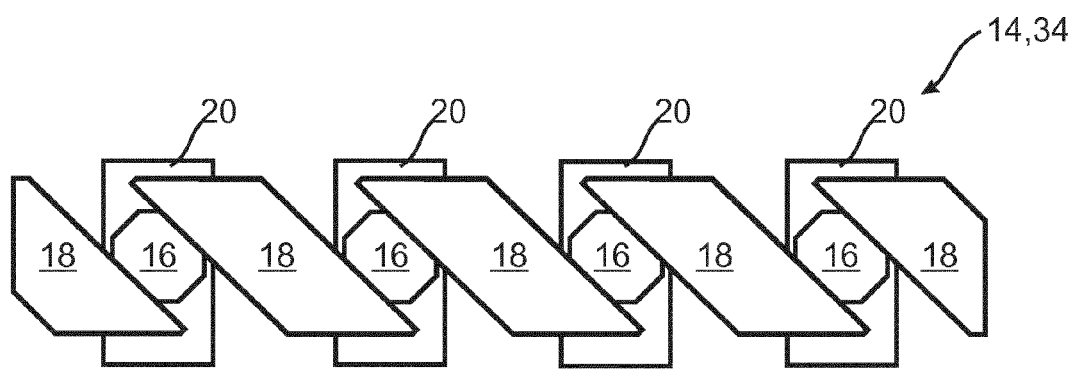
FIG. 6 an embodiment of a resistance device in accordance with the invention.

FIG. 6 shows a linear arrangement of a row of AMR resistor elements 16, which are connected together to form a resistor device 14. A magnetization element 20 is assigned to each resistor element 16, and the conductive strips 18 contact the resistor elements 14 in such a way as to result in a flow of current $I_S$ at a linearization angle α of about 45° relative to the initial magnetization $M_0$ of the resistor element 16. The greater the number of AMR resistor elements 14, the greater the total resistance and the resistance change relative to an external magnetic field $H_e$. By arranging a plurality of resistor elements 16 in one resistor device 14, the current consumption is lowered, so that devices that are in particular operated by batteries have a longer battery life.

Figure 7A:
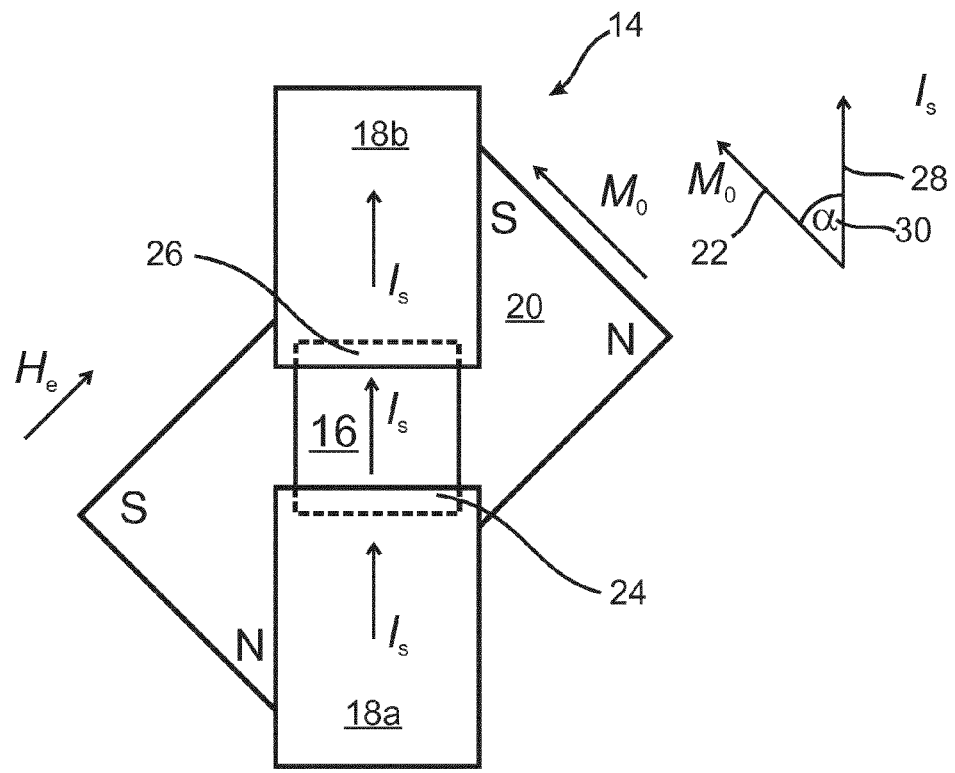
FIG. 7 further embodiments of a resistance device in accordance with the invention.
Figure 7B:
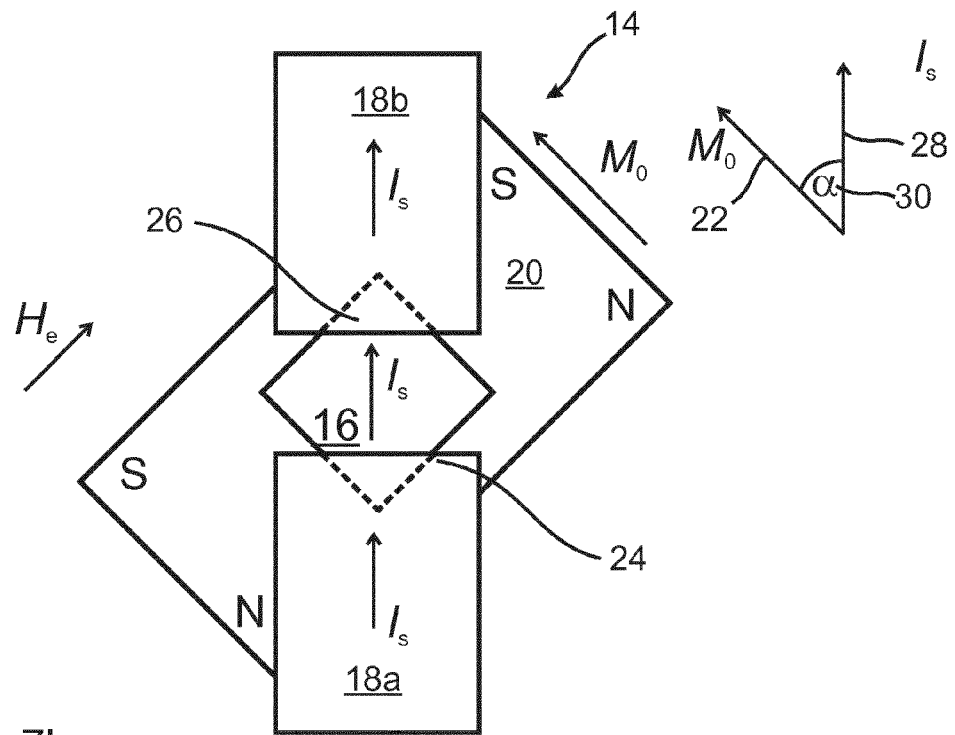
Figure 8:
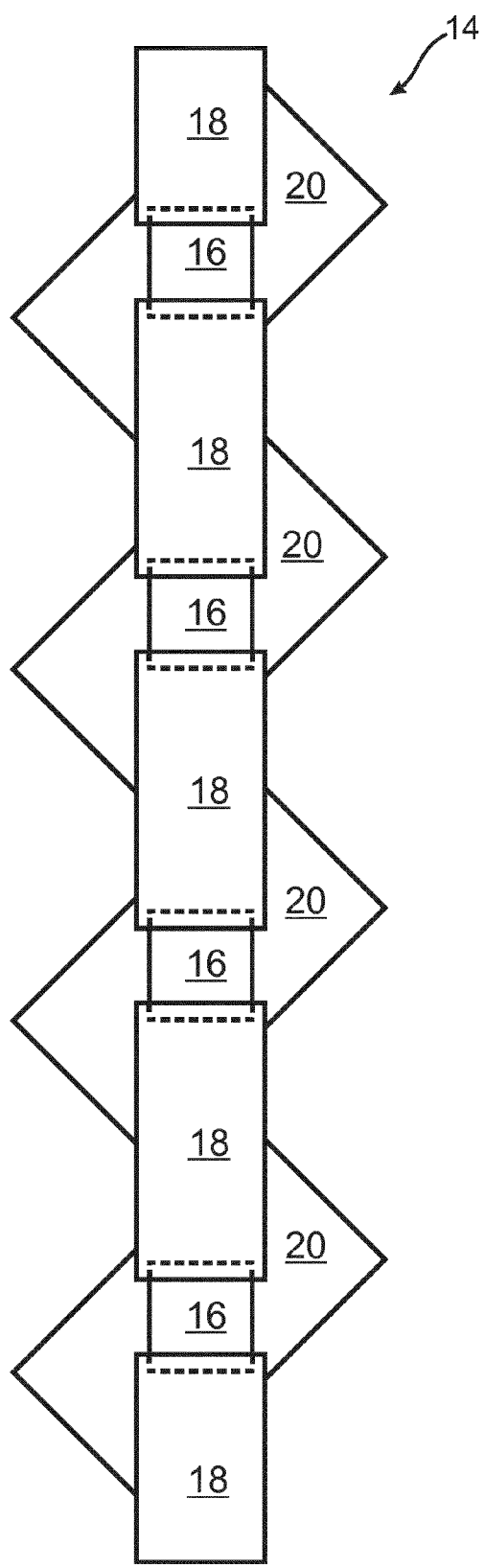
FIG. 8 an embodiment of a resistance device in accordance with the invention.

FIGS. 7a and 7b show further exemplary embodiments of resistor devices 14 corresponding to FIG. 3, consisting in simplified form of one resistor element 16, one magnetization element 20, and two conductive strips 18, 18b. FIG. 8 shows a series connection of four apparatuses 14 according to FIG. 7a, which can be arranged on one chip substrate 12. As a rule, one resistor device 14 comprises several, in particular more than 10, embodiments according to FIG. 7 and electrically connected in series. In contrast to the embodiment according to FIG. 3, the AMR resistor element 16 is square in form and, as is shown in FIG. 7a, rotated by 45° relative to the rectangular magnetization element 20 on which it is arranged. As is shown in FIG. 7b, it can also be aligned parallel to the lateral edges of the magnetization element 20. The conductive strips 18 have a substantially rectangular form and cover the resistor element 14 in overlapping contact regions 24, 26. The magnetization element 20 covers the whole area of the resistor element 14. The magnetization axis 22 in this configuration is angled at 45° relative to the straight current flow vector 28, which is aligned parallel to and in the same direction in the conductive strips 18a, 18b and the resistor element 14. Accordingly, an embodiment of this type can measure an external magnetic field component $H_e$ that is angled at 45° relative to the longitudinal extent of the magnetic field resistor devices 14 shown in FIG. 8. This means that rows of resistor devices 14 of this type are aligned on a chip substrate 12 at the linearization angle α relative to the external magnetic field $H_e$ to be measured. Each of the arrangements according to FIG. 3, 7a or 7b exhibits symmetry relative to the current vector 28 and to the magnetization vector 22, so that a homogeneous magnetic initial magnetization and current distribution are obtained in the resistor element 14.

Figure 9:
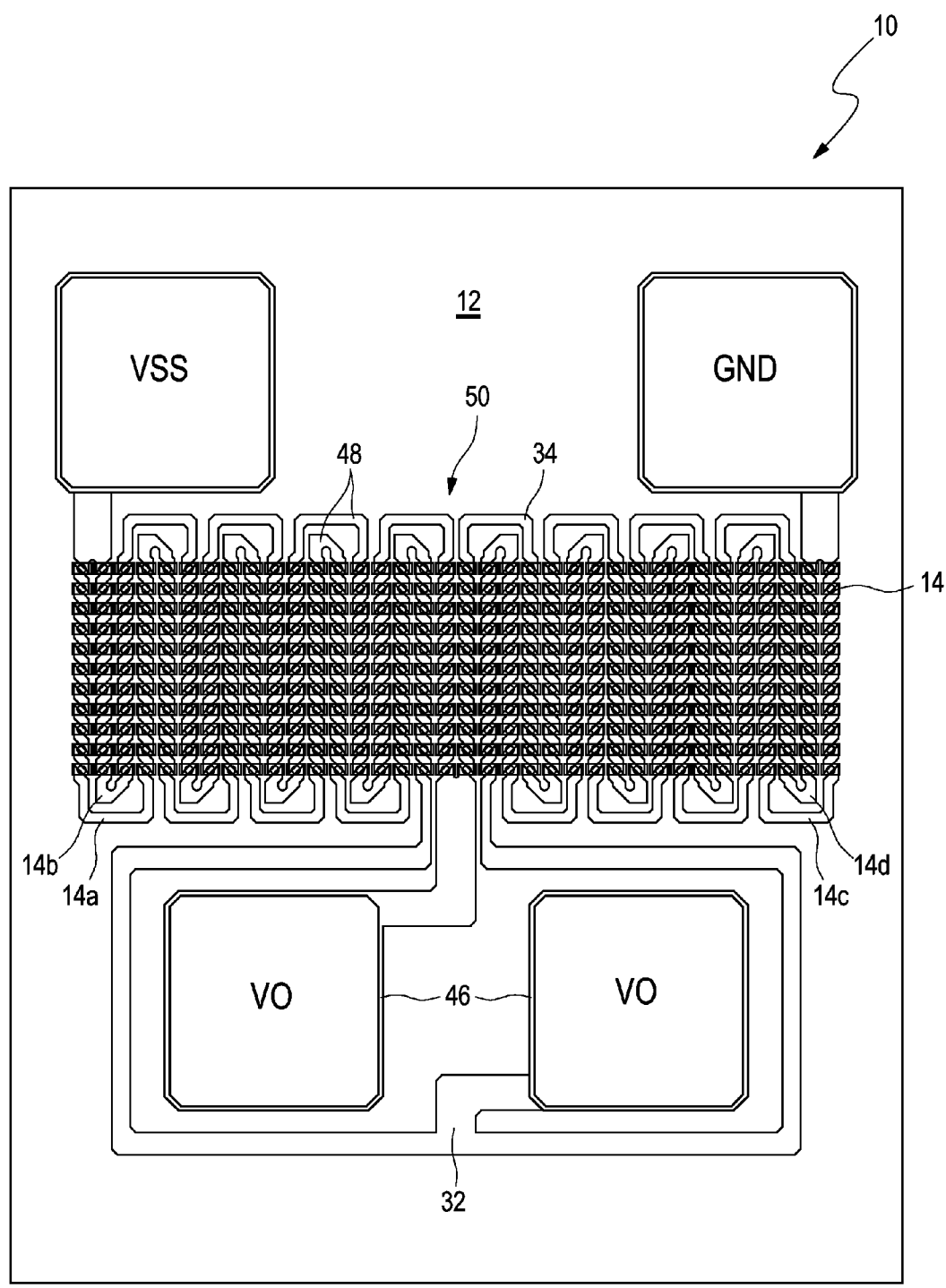
FIG. 9 a chip layout of an exemplary embodiment of an AMR resistor apparatus.

FIG. 9 illustrates an exemplary embodiment of a layout of a magnetic field sensor apparatus 10 consisting of four resistor devices 14 made up of a plurality of resistor elements 16 connected in series. The individual rows of the resistor elements 16 of two resistor devices 14 mesh with one another interdigitally in order to achieve a homogenization of the resistors. The individual rows of the resistor device 40 are constructed in accordance with the exemplary embodiment shown in FIG. 6. Four resistor devices 14a to 14d are interconnected to form a Wheatstone measuring bridge on the chip layout, where voltage can be applied to the two branches of the Wheatstone measuring bridge through the VSS and GND contacts, and the center taps V0 of the two branches are implemented as measurement patches V0. With the aid of the magnetic field sensor apparatus 10 shown in FIG. 7, a component of an external magnetic field $H_e$ can be measured. To determine a three-dimensional magnetic field, for example for a magnetic field compass apparatus, three magnetic field sensor apparatuses 10 offset by 90° relative to one another are required, each of which is arranged at an angle of 90° to the others. Two magnetic field sensor apparatuses offset by 90° for measuring the magnetic field in two dimensions can be arranged on a chip substrate.

Figure 10:
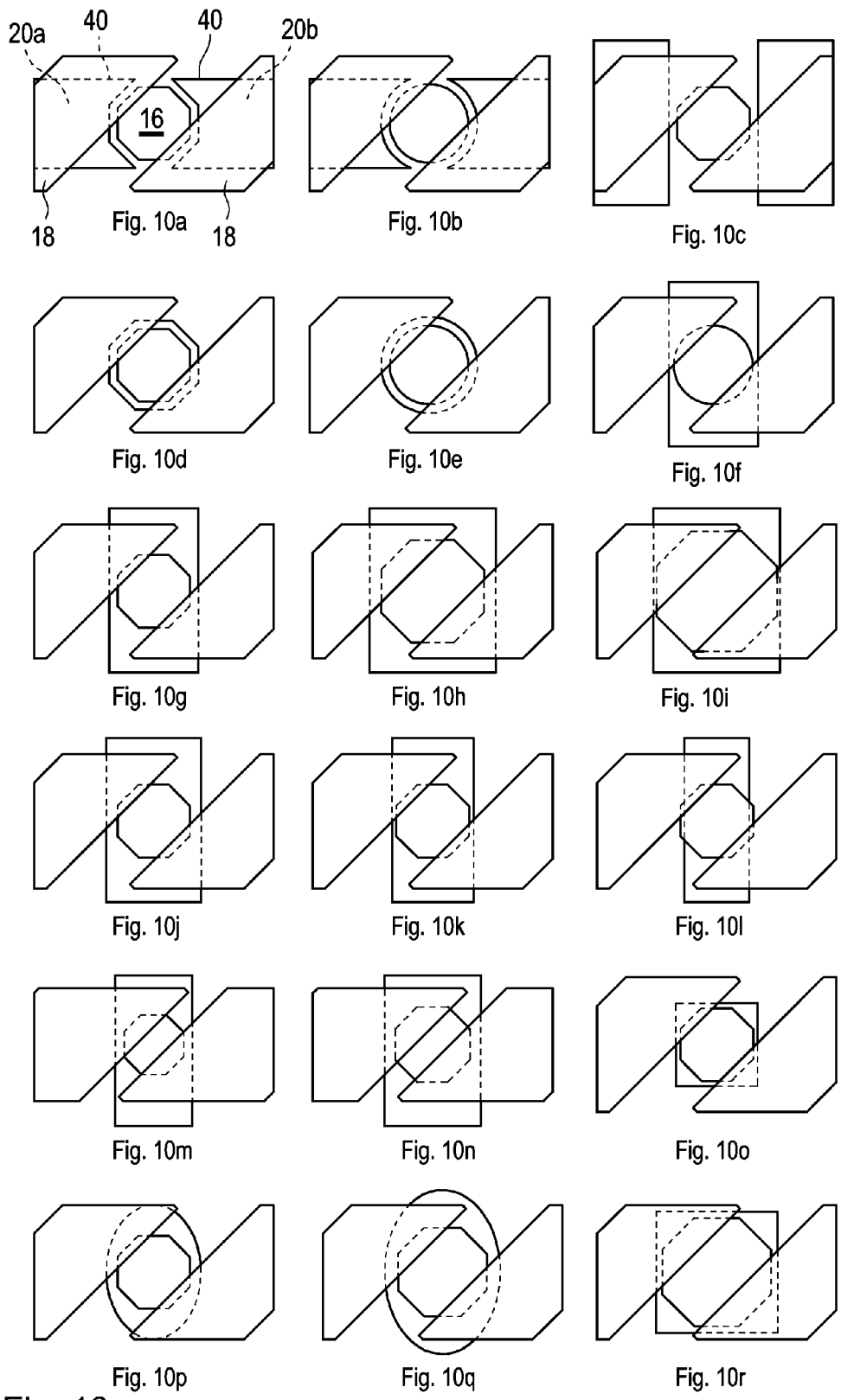
FIG. 10 various exemplary embodiments of magnetic field sensor apparatuses, where the AMR resistor element and the magnetization element can be arranged relative to one another in different variations.

Finally, FIG. 10 shows eighteen different exemplary embodiments of how resistor elements 16 can be arranged relative to conductive strips 18 and magnetization elements 20. In the first exemplary embodiments 10a to 10c, two magnetization elements 20a, 20b are assigned to one resistor element 16, which may be octagonal or round in shape. The respective ends of the magnetization elements 20a, 20b are formed with a shape complementary to the peripheral regions of the resistor elements 16, so that as little stray flux as possible is created, and the best possible penetration of the resistor element by the magnetic fields from the north pole of one magnetization element to the south pole of the other can occur.

In FIGS. 10d and 10e the magnetization element 20 is formed with an identical shape, but slightly larger in comparison with the shape of the resistor element 16, so that small size is achieved and only a small quantity of magnetization material must be used.

FIGS. 10f to 10o and 10r show a 1:1 ratio between a resistor element 16 and a magnetization element 20, where the magnetization element 20 can always be rectangular, with different coverage sizes, and the resistor element can be round or octagonal in various sizes.

Finally, FIGS. 10p to 10q show magnetization elements 20 with an elliptical form, whose magnetization field can be aligned parallel or perpendicular to the direction of the flow of the measurement current through a row of AMR resistor elements 16. Further variations and combinations of these exemplary embodiments are possible as required.

The chip substrate is preferably a substrate based on SiO2. The intermediate layer can be of a SiN (silicon mononitride) material with a layer thickness between 10 nm and 1000 nm. The thickness of the permanent magnet elements can be from 10 nm to 100 nm, and the permanent magnet elements can consist of a CoPtCr (cobalt-platinum-chromium) compound. An AlOx compound may also be considered for the intermediate material. The magneto-resistive AMR structures preferably have a symmetrical form, and the permanent magnet elements cover the whole area of these, or cover them along a peripheral section, so that a stray magnetic field of the permanent magnet elements passes through the AMR resistor elements.

The invention claimed is:

1. Magnetic field sensor apparatus for measuring one magnetic field vector component $H_e$, comprising at least one anisotropic magnetoresistive resistor device (AMR resistor device) arranged on a chip substrate, where the AMR resistor device comprises a plurality of magnetoresistive AMR resistor elements (resistor elements) which are connected in series by electrically conductive strips, wherein at least one permanent magnetic element generating an initial magnetization field $H_0$ with a magnetization axis is assigned to each of the resistor elements so that each resistor element is permeated by the initial magnetization field $H_0$ of the at least one permanent magnetic element in a direction of a magnetization axis of the at least one permanent magnetic element, where a measurement current $I_S$ flowing through the resistor element from a contact region between a first conductive strip and the resistor element to a contact region between the resistor element and a second conductive strip has a mean current direction axis at a predefined linearization angle $\alpha>0°$ and $\alpha<90°$ relative to the magnetization axis.

2. Magnetic field sensor apparatus according to claim 1, wherein the value of the linearization angle is $|\alpha|=45°$.

3. Magnetic field sensor apparatus according to claim 1, wherein each AMR resistor device comprises a series circuit of more than ten resistor elements which are arranged along one or more straight rows on the chip substrate, where the magnetization axis of each of the at least one permanent magnetic elements is aligned at least one of parallel, perpendicular or 45° to a longitudinal extent of a corresponding resistor device to which it is assigned.

4. Magnetic field sensor apparatus according to claim 1, wherein the resistor element is formed as a platelet and has a symmetrical footprint.

5. Magnetic field sensor apparatus according to claim 1, wherein one permanent magnetic element is assigned to each of the resistor elements, and wherein a magnetic flux of each permanent magnetic element passes at least partly through the resistor element to which it is assigned.

6. Magnetic field sensor apparatus according to claim 5, wherein each permanent magnetic element covers a full area of the resistor element to which it is assigned.

7. Magnetic field sensor apparatus according to claim 1, wherein two permanent magnetic elements aligned along a common magnetization axis are assigned to each resistor element, and wherein a magnetic flux from a north pole of one permanent magnetic element of the two permanent magnetic elements to a south pole of an adjacent permanent magnetic element of the two permanent magnetic elements passes at least partly through the resistor element to which the two permanent magnetic elements are assigned.

8. Magnetic field sensor apparatus according to claim 7, wherein the resistor element to which the two permanent magnetic elements are assigned is arranged between end regions of the two permanent magnetic elements, and wherein the end regions have a shape complementary to a shape of at least a section of a periprhy of the resistor element to which the two permanent magnetic elements are assigned.

9. Magnetic field sensor apparatus according to claim 1, wherein a layer thicknesses of the at least one permanent magnetic element and the resistor element to which it is assigned is at most 10 µm, and wherein a layer thickness of the at least one permanent magnetic element is not more than ten times a layer thickness of the resistor element to which it is assigned.

10. Magnetic field sensor apparatus according to claim 1, comprising at least two AMR resistor devices, each AMR resistor device comprising a plurality of resistor elements arranged in straight and parallel rows, the rows of two AMR resistor devices of the at least two AMR resistor devices being arranged to mesh with one another interdigitally, and wherein linearization angles of the interdigitally arranged AMR resistor devices are displaced by 90° relative to one another, and wherein the AMR resistor devices are interconnected in a form of a half-bridge or a full bridge.

11. Magnetic field sensor apparatus according to claim 1, wherein the at least one permanent magnetic element is elements are arranged in a lower planar layer of the chip substrate, on top of which a layer comprising the resistor elements is arranged, and on top of that a layer comprising the electrically conductive strips is arranged.

12. Magnetic field sensor apparatus according to claim 11, wherein an essentially magnetically neutral intermediate layer is arranged between the layer of the resistor elements and the layer of the at least one permanent magnetic element, and wherein the intermediate layer consists of an electrical insulator, and wherein an insulating covering layer is applied to the layer comprising the electrically conductive strips.

13. Magnetic field sensor apparatus according to claim 1, wherein a compensation conductor is arranged in one or more further planar layers through which a compensation current $I_C$ flows in a sensing state for generating a compensating magnetic field perpendicular to the magnetization axis of the initial magnetization $M_0$, so that a component of an external magnetic field to be measured is compensated at the magnetically sensitive regions of the sensor.

14. Compass system comprising one, two, or three magnetic field sensor apparatuses arranged at angles to one another according to claim 1, which are integrated into an electronic assembly for detecting the direction and strength of a magnetic field.

15. Current measuring system comprising at least one magnetic field sensor apparatus according to claim 1, which is integrated into an electronic assembly for measuring a current strength of one or more conductors by measuring the strength of the magnetic field surrounding the conductor.

\* \* \* \* \*